United States Patent
Ma et al.

(10) Patent No.: US 6,924,522 B2
(45) Date of Patent: Aug. 2, 2005

(54) EEPROM TRANSISTOR FOR A DRAM

(75) Inventors: Manny K. F. Ma, Boise, ID (US); Yauh-Ching Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/153,255

(22) Filed: May 21, 2002

(65) Prior Publication Data

US 2002/0135005 A1 Sep. 26, 2002

Related U.S. Application Data

(62) Division of application No. 09/361,471, filed on Jul. 27, 1999, now Pat. No. 6,391,755, which is a continuation of application No. 08/831,361, filed on Apr. 1, 1997, now Pat. No. 5,973,344, which is a division of application No. 08/639,186, filed on Apr. 26, 1996, now Pat. No. 5,723,375.

(51) Int. Cl.⁷ ...................... H01L 27/108; H01L 29/788
(52) U.S. Cl. ............... 257/296; 257/315; 257/E21.646; 257/E21.648; 257/E27.084; 257/306; 438/241; 438/258; 438/593
(58) Field of Search ................................ 257/296, 315, 257/E21.646, E21.648, E27.084, 306; 438/241, 258, 593

(56) References Cited

U.S. PATENT DOCUMENTS

| | | | |
|---|---|---|---|
| 3,590,337 A | 6/1971 | Wegener | 317/234 |
| 4,888,630 A * | 12/1989 | Paterson | 365/185.24 |
| 5,175,120 A | 12/1992 | Lee | 437/48 |
| 5,281,548 A | 1/1994 | Prall | 437/43 |
| 5,292,681 A | 3/1994 | Lee et al. | 437/48 |
| 5,389,567 A | 2/1995 | Acovic et al. | 437/52 |
| 5,397,727 A * | 3/1995 | Lee et al. | 438/257 |
| 5,416,347 A | 5/1995 | Katto et al. | 257/296 |
| 5,442,210 A | 8/1995 | Kanehachi | 257/296 |
| 5,612,238 A * | 3/1997 | Sato et al. | 438/3 |
| 5,723,375 A * | 3/1998 | Ma et al. | 438/258 |
| 5,739,566 A * | 4/1998 | Ota | 257/315 |
| 5,973,344 A * | 10/1999 | Ma et al. | 257/296 |
| 6,391,755 B2 * | 5/2002 | Ma et al. | 438/593 |

* cited by examiner

Primary Examiner—M. Wilczewski
(74) Attorney, Agent, or Firm—Schwegman, Lundberg, Woessner & Kluth, P.A.

(57) ABSTRACT

A floating gate transistor is formed by simultaneously creating buried contact openings on both EEPROM transistor gates and DRAM access transistor source/drain diffusions. Conventional DRAM process steps are used to form cell storage capacitors in all the buried contact openings, including buried contact openings on EEPROM transistor gates. An EEPROM transistor gate and its associated cell storage capacitor bottom plate together forms a floating gate completely surrounded by insulating material. The top cell storage capacitor plate on an EEPROM transistor is used as a control gate to apply programming voltages to the EEPROM transistor. Reading, writing, and erasing the EEPROM element are analogous to conventional floating-gate tunneling oxide (FLOTOX) EEPROM devices. In this way, existing DRAM process steps are used to implement an EEPROM floating gate transistor nonvolatile memory element.

19 Claims, 4 Drawing Sheets

EEPROM TRANSISTOR FOR A DRAM

This application is a Divisional of U.S. Ser. No. 09/361,471, filed Jul. 27, 1999, now U.S. Pat. No. 6,391,755, which is a Continuation of U.S. Ser. No. 08/831,361, filed Apr. 1, 1997, now U.S. Pat. No. 5,973,344, which is a Divisional of U.S. Ser. No. 08/639,186, filed Apr. 26, 1996, now U.S. Pat. No. 5,723,375 which are incorporated herein by reference.

THE FIELD OF THE INVENTION

The present invention relates to semiconductor integrated circuits and, more particularly, to fabrication of an electrically erasable and programmable read-only memory (EEPROM) element compatible with a dynamic random access memory (DRAM) process.

BACKGROUND OF THE INVENTION

During fabrication of dynamic random access memory (DRAM) integrated circuit die on a semiconductor wafer, it is desirable to include a nonvolatile storage element which can be programmed during wafer probe and device testing. For example, programming a nonvolatile storage element could be used to identify the DRAM die, to reconfigure a tested DRAM array having defective memory cells into a smaller DRAM array having only functional cells, or even to remap defective DRAM memory cell addresses so that functional redundant cells are addressed instead.

There are several ways to implement nonvolatile storage on a DRAM integrated circuit die. For example, fusible links could be fabricated and data represented by using a laser to selectively create open circuits in the links. Such a nonvolatile memory is not reprogrammable since the vaporized fusible links cannot be reliably restored.

Laser trimming involves precise control of the power and position of the focused energy. It is more convenient to electrically program nonvolatile memory during wafer probe without using a laser. Fuses exist which can be selectively electrically programmed by exceeding a certain current and thereby creating an open circuit in the fuse. Antifuses can also be selectively electrically programmed by applying a voltage to break down a dielectric material contacted by two conductive terminals of the antifuse. This permanently changes the resistance presented by the antifuse from a high resistance to a low resistance.

Both fuses and antifuses implement non-reprogrammable nonvolatile memory. For example, if the wrong die identification data is programmed, this data is permanently associated with the programmed die.

Electrically erasable and programmable read only memory (EEPROM) techniques also implement nonvolatile memory on integrated circuits. EEPROMs can be electrically programmed, erased, and reprogrammed. One technique of implementing an EEPROM is by use of a floating gate tunneling oxide (FLOTOX) transistor. To create a FLOTOX transistor, a field-effect transistor (FET) having source, drain, substrate, and gate terminals is modified to electrically isolate (float) the gate. This polycrystalline silicon (polysilicon) floating gate is created over a thin insulating layer of silicon dioxide (gate oxide). A second polysilicon gate (control gate) is created above the floating gate. The floating gate and control gate are separated by an interpoly insulating layer.

Since the floating gate is electrically isolated, any charge stored on the floating gate is trapped. Storing sufficient charge on the floating gate will create an inversion channel between source and drain of the FET. Thus, the presence or absence of charge on the floating gate can represent two distinct data states.

FLOTOX transistors are selectively programmed by transferring electronic charges through the thin gate oxide onto the floating gate by Fowler-Nordheim tunneling. With the substrate voltage held at ground, the control gate is raised to a sufficiently high positive voltage so that electrons are transferred from the substrate to the floating gate by tunneling through the insulating thin gate oxide. The Fowler-Nordheim tunneling process is reversible. The floating gate can be erased by grounding the control gate and raising the drain voltage to a sufficiently high positive voltage to transfer electrons out of the floating gate to the drain terminal of the transistor by tunneling through the insulating gate oxide. The voltage applied to the control gate during programming is higher than the voltage applied to the drain during erasure because, while the erasure voltage is applied directly across the gate oxide, the programming voltage is applied to the control gate and capacitively coupled onto the floating gate.

The transistors can be selectively reprogrammed in the same manner as described above, since the Fowler-Nordheim tunneling process is nondestructive. The programming and erasure voltages which effect Fowler-Nordheim tunneling are higher than the voltages normally used in reading the memory. The Fowler-Nordheim tunneling effect is negligible at the lower voltages used in reading the memory, allowing a FLOTOX transistor to maintain its programmed state for years if subjected only to normal read cycles.

Since reprogrammable nonvolatile memory is useful for DRAM die identification and reconfiguring and remapping defective DRAM memory cells, it is desired to implement EEPROM through floating gate transistor structures which are compatible with existing DRAM processing steps.

SUMMARY OF THE INVENTION

The present invention implements reprogrammable nonvolatile memory on a DRAM integrated circuit by forming a floating gate transistor using processing steps which are compatible with a conventional DRAM process.

In particular, the present invention describes a structure and method for forming a floating gate transistor by simultaneously creating a buried contact opening on both an EEPROM transistor gate and a DRAM access transistor source/drain diffusion. DRAM cell storage capacitors are fabricated in all the buried contact openings, including the buried contact openings on EEPROM transistor gates. Such storage capacitors are created using conventional DRAM process steps to form a conductive bottom plate layer, a thin dielectric layer, and a conductive top plate layer.

An EEPROM transistor gate and its associated bottom capacitor plate together form a floating gate completely surrounded by insulating material. The top capacitor plate is used as a control gate with which to program the EEPROM device transferring electrons through the transistor gate oxide by Fowler-Nordheim tunneling. Reading, writing, and erasing the EEPROM element are analogous to conventional floating-gate tunneling oxide (FLOTOX) EEPROM devices. In this way, conventional DRAM process steps are used to implement an EEPROM floating gate transistor nonvolatile memory element.

In one embodiment, the EEPROM transistor's associated bottom capacitor plate and control gate are fabricated on field oxide outside of the transistor's active area.

In another embodiment, the EEPROM's transistor's associated bottom capacitor plate and control gate are fabricated to overlap the transistor's active area.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
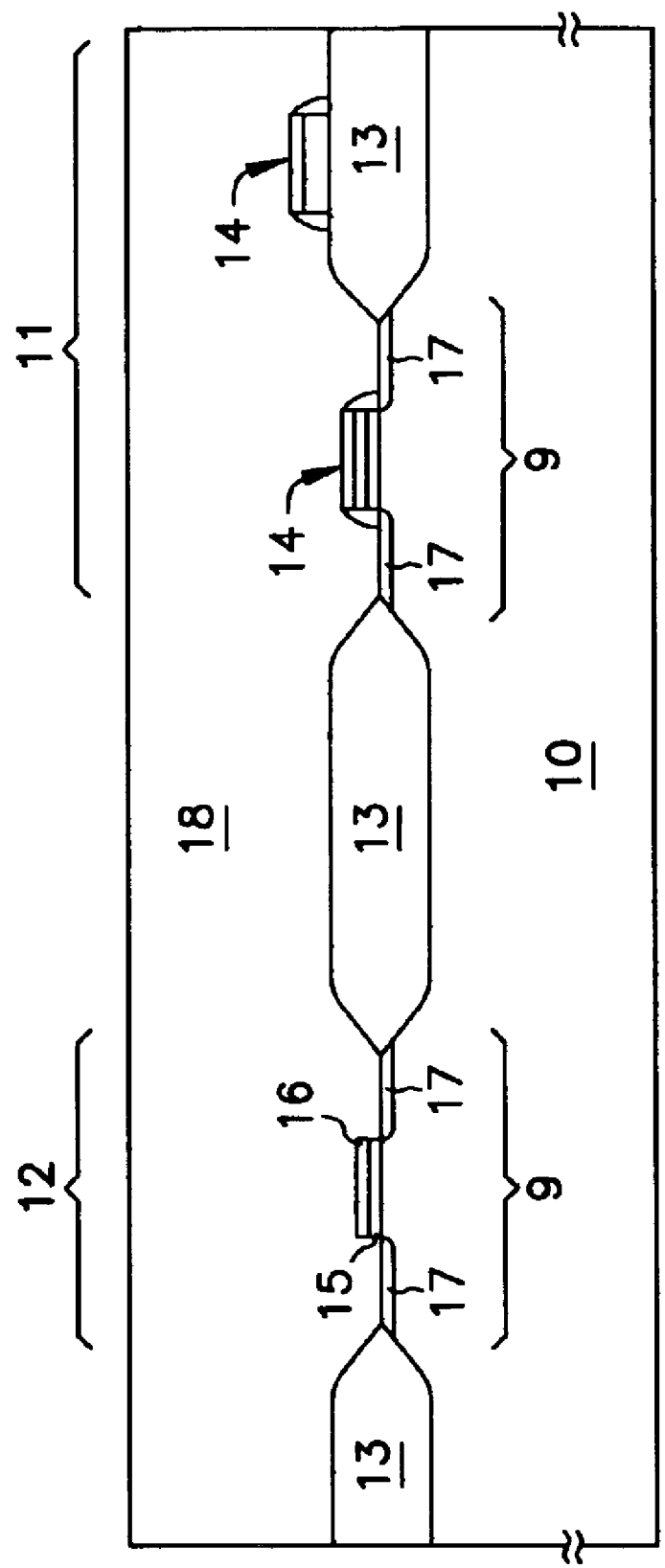
FIG. 1 is a schematic cross-sectional view of a supporting substrate having a FET in an DRAM memory cell region and a FET in an EEPROM memory cell region.
Figure 2:
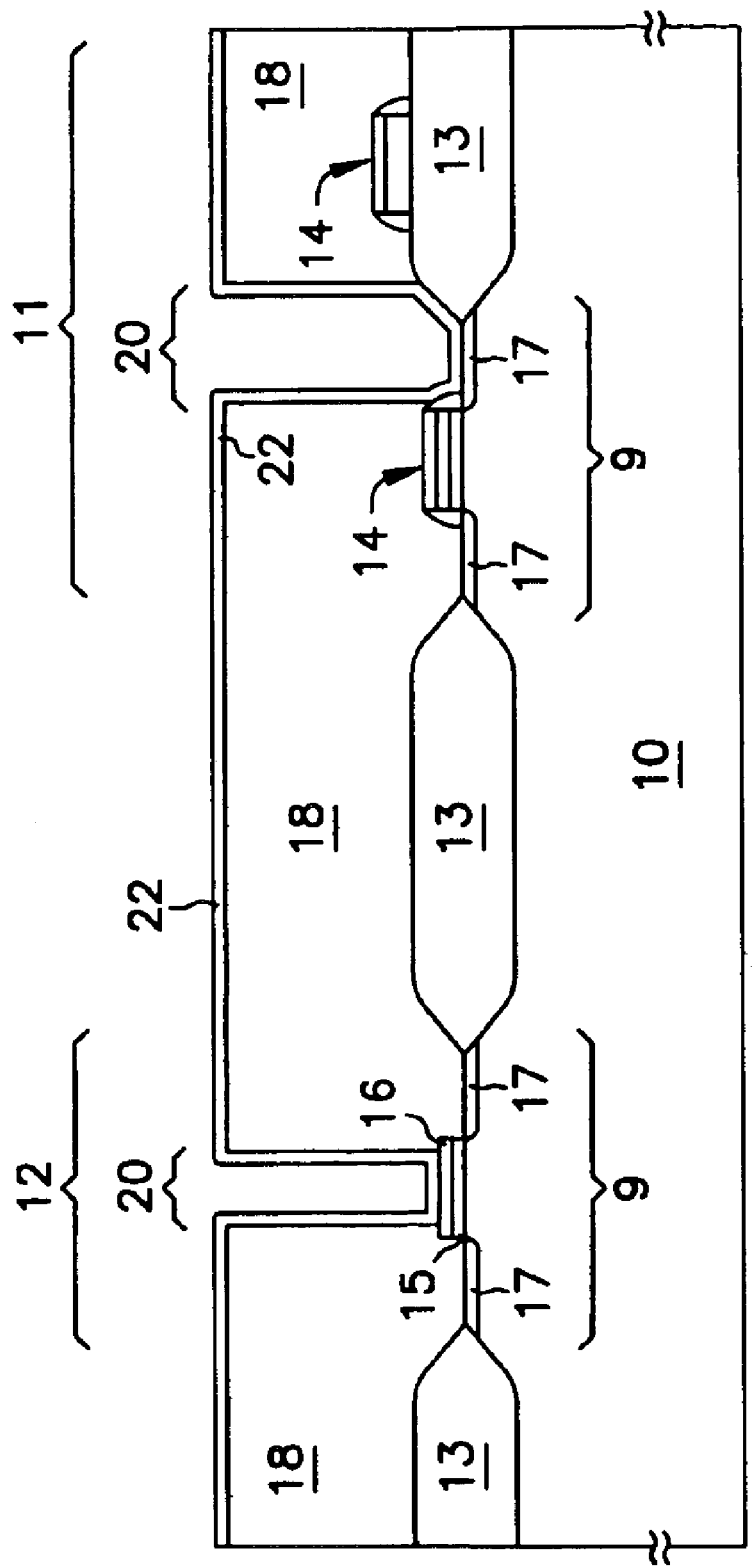
FIG. 2 is the view of FIG. 1 having buried contact openings and a conductive bottom plate layer in both the DRAM memory cell region and the EEPROM memory cell region.
Figure 3:
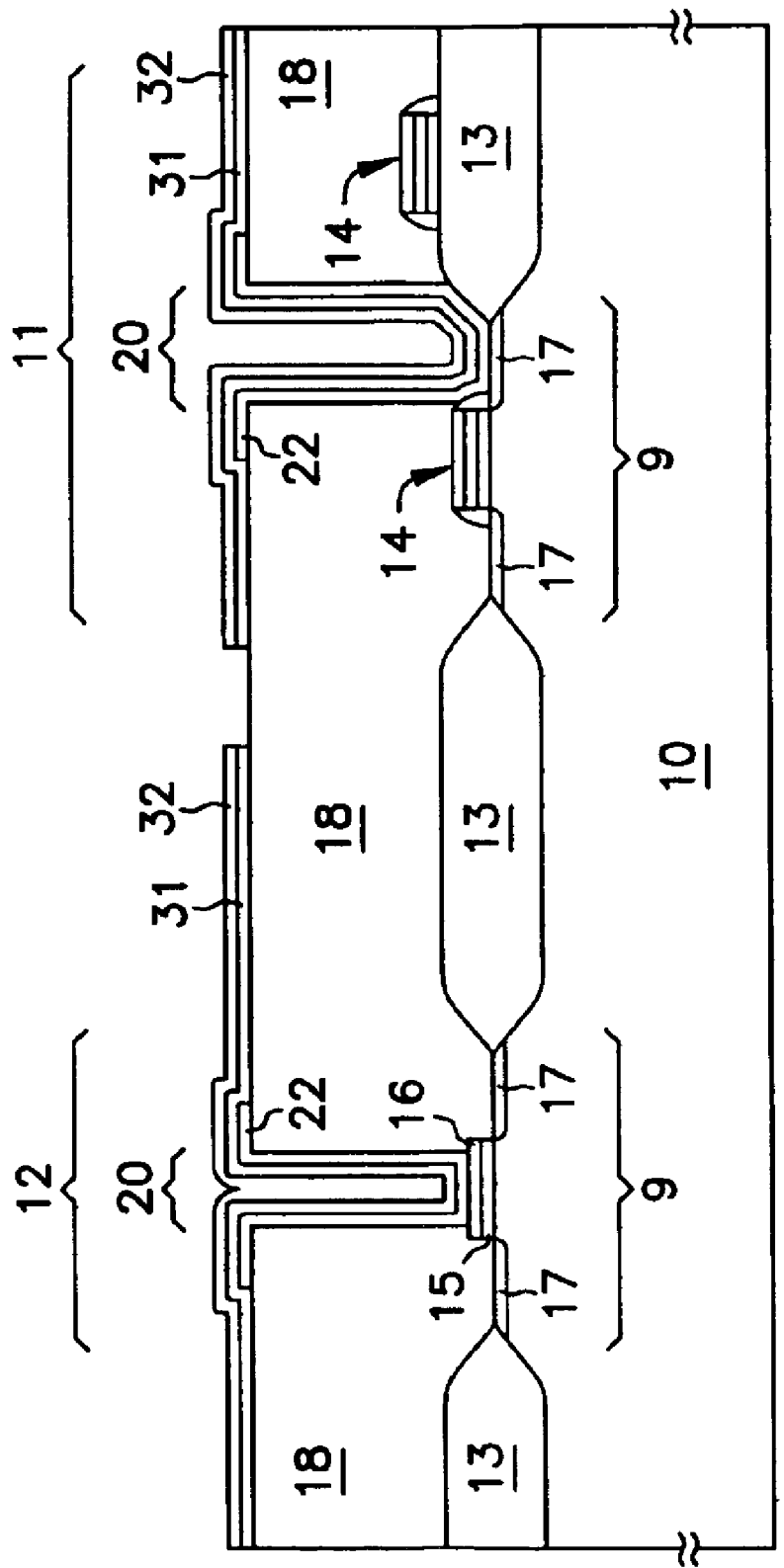
FIG. 3 is the view of FIG. 2 having the conductive bottom plate layer selectively etched, a thin dielectric layer deposited, and a conductive top plate layer deposited.
Figure 4:
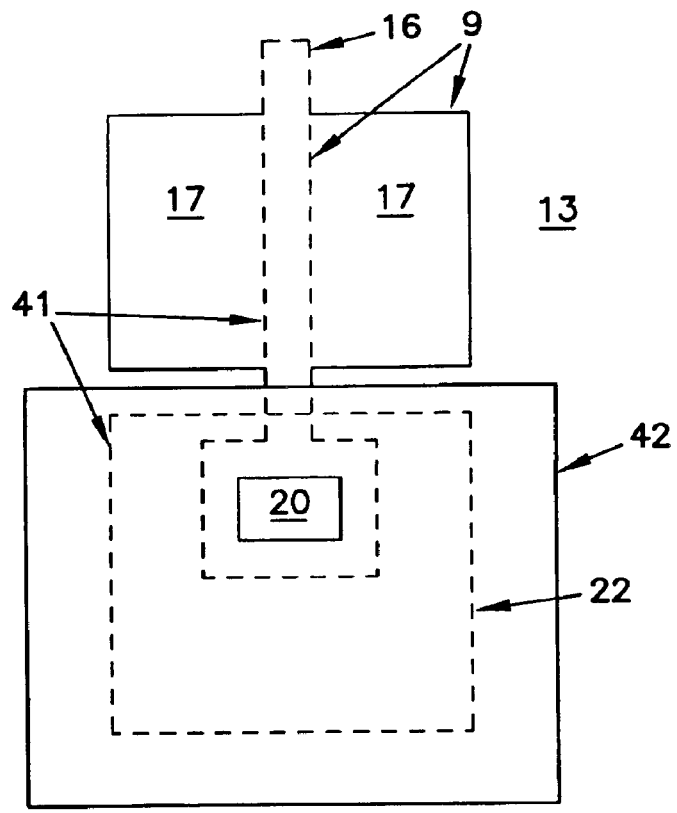
FIG. 4 is a top view looking at the surface of the wafer illustrating possible embodiment of the EEPROM memory cell region in which EEPROM features do not overlay the transistor active area.
Figure 5:
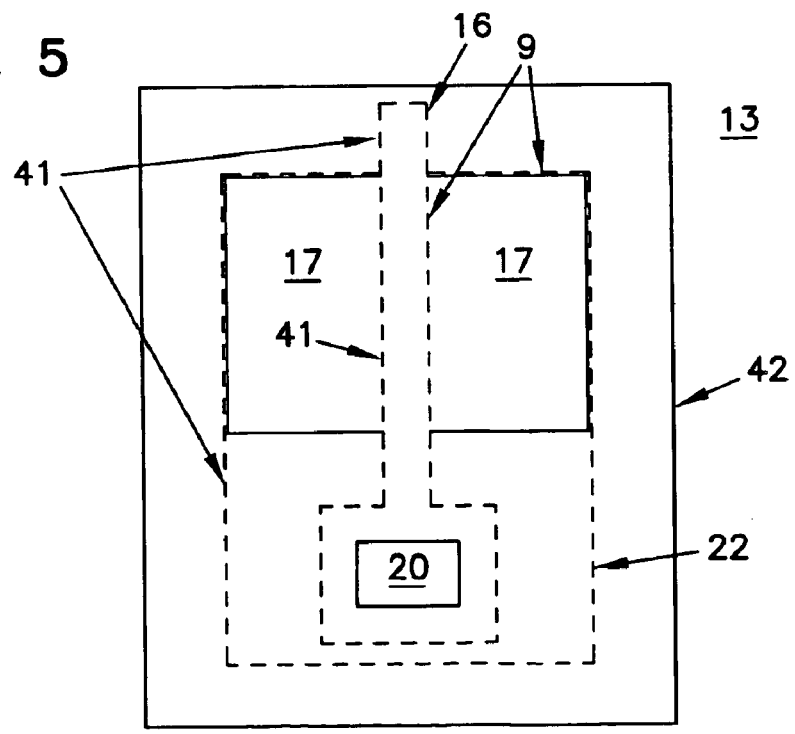
FIG. 5 is a top view looking at the surface of the wafer illustrating a second possible embodiment of the EEPROM memory cell region in which EEPROM features do overlay the transistor active area.

The method for forming a DRAM storage capacitor is described in detail. The sequence of fabrication steps pertaining to the floating gate transistor is shown in FIGS. 1–3. It should be well understood by one skilled in the art that the FIGS. depict single floating gate and DRAM memory elements. Multiple floating gate and DRAM memory elements can be fabricated simultaneously on multiple integrated circuit die on a semiconductor wafer. FIGS. 4–5 show two possible embodiments of the EEPROM cell region.

The schematic cross-sectional view of FIG. 1 illustrates a semiconductor substrate 10. A DRAM access transistor region 11 and an EEPROM cell region 12 include active area regions 9 where transistors are to be created. Regions of thick insulating silicon dioxide called field oxide 13 are grown around the active areas 9 thereby completely enclosing the active areas 9 along the surface of the wafer. The field oxide 13 electrically isolates field-effect transistors (FETs) from each other.

In FIG. 1, wordline 14 serves as a common gate electrode for multiple memory access transistors in the DRAM cell array. Such wordlines 14 are part of a conventional DRAM process, and typically consist of multiple stacked layers including an oxide gate dielectric and a conductively doped polycrystalline silicon (polysilicon) gate electrode.

In FIG. 1, gate regions are formed in the EEPROM cell regions 12 by forming an approximately 100 angstrom thick layer of gate oxide 15 and a conductively doped polysilicon gate electrode 16. The gate oxide 15 must be sufficiently thin to allow Fowler-Nordheim tunneling for programming and erasing the cell. Source/drain diffusions 17 have also been implanted. An insulating interpoly dielectric layer 18 is deposited, for example, by chemical vapor deposition (CVD) of tetraethyl orthosilicate (TEOS). The interpoly dielectric layer 18 may exhibit some surface topography from the conformal CVD or the interpoly dielectric layer 18 may be planarized during an existing DRAM process step.

The schematic cross-sectional view of FIG. 2 illustrates the view of FIG. 1 after further processing. Buried contact openings 20 are selectively anisotropically etched through the interpoly dielectric layer 18 in both the memory access transistor region 11 and the EEPROM cell region 12. In the memory access transistor region 11, this anisotropic etch of the interpoly dielectric layer 18 stops on source/drain diffusion 17 of a memory access transistor. In an EEPROM cell region 12, the anisotropic etch of dielectric layer 18 stops on the polysilicon gate electrode 16. Since the polysilicon gate electrode 16 is at a greater height from the substrate 10 than the memory access transistor source/drain diffusion 17 in memory access transistor region 11, the anisotropic etch must remove more of the interpoly dielectric layer 18 in the memory cell access transistor region 11 than in the EEPROM cell region 12. For this reason, the etchant must have sufficient selectivity of the interpoly dielectric layer 18 material with respect to the polysilicon gate electrode 16 material.

In FIG. 2, a conductive bottom plate layer 22 is conformally deposited on the interpoly dielectric layer 18 and within the buried contact openings 20. In the preferred embodiment, this conductive bottom plate layer 22 is CVD deposited conductively doped polysilicon. In the memory access transistor region 11, the conductive bottom plate layer 22 is used as a storage capacitor bottom plate electrode which physically and electrically contacts the memory access transistor source/drain diffusion 17. In the EEPROM cell region 12 the conductive bottom plate layer 22 physically and electrically contacts the polysilicon gate electrode 16 of the transistor.

FIG. 3 illustrates the view of FIG. 2 after additional processing steps. The conductive bottom plate layer 22 is patterned using conventional masking and etching steps. In the EEPROM cell region 12, the patterned conductive bottom plate layer 22 together with the individually contacted polysilicon gate electrodes 16 form individual floating gates. In the memory cell access transistor region 11, the patterned conductive bottom plate layer 22 forms individual memory cell storage capacitor bottom plate electrodes.

In FIG. 3, a thin dielectric layer 31 is formed on the conductive bottom plate layer 22. In the preferred embodiment, this thin dielectric layer 31 is approximately 150 angstroms thick silicon nitride conformally deposited by CVD as a conventional DRAM process step which forms the thin dielectric layer 31 of a memory storage capacitor.

In FIG. 3, a conductive top plate layer 32 is deposited on the thin dielectric layer 31. In the preferred embodiment, this conductive top plate layer 32 is CVD deposited conductively doped polysilicon. In the memory access transistor region 11, the conductive top plate layer 32 is used as the top plate electrode of a storage capacitor. In the EEPROM cell region 12, the conductive top plate layer 32 is used as a control gate for applying programming voltages.

In FIG. 3, the conductive top plate layer 32, and optionally the thin dielectric layer 31, can be patterned using conventional masking and etching steps in a conventional DRAM process flow. In the memory access transistor region 11, individual memory storage capacitor top plate electrodes can be patterned from the conductive top plate layer 32, or such electrodes can be left interconnected by the conductive top plate layer 32 if desired. In the EEPROM cell region 12, individual control gate electrodes can be patterned from the conductive top plate layer 32 or such electrodes can be left interconnected by the conductive top plate layer 32 if desired.

FIG. 4 illustrates a top view of one possible embodiment of the EEPROM cell region 12, as seen in FIG. 3, after the conductive top plate layer 32 (FIG. 3) has been selectively etched forming individual floating gates in each EEPROM cell region 12 (FIG. 3). Source/drain regions 17 and polysilicon gate electrode 16 form a conventional field-effect transistor. The buried contact region 20 is formed on the polysilicon gate electrode 16 which is on field oxide 13 (see also FIG. 3) outside the transistor active area 9. This buried contact 20 forms an opening through interpoly dielectric 18 (FIG. 3).

In FIG. 4, the patterned conductive bottom plate layer 22 makes contact to the polysilicon gate electrode 16 within the buried contact opening 20 in the interpoly dielectric 18 (FIG. 3). Being physically and electrically connected, the patterned conductive bottom plate layer 22 and polysilicon gate electrode 16 together form a floating gate electrode 41. The thin dielectric layer 31 (FIG. 3) is formed on the floating gate electrode 41 and elsewhere on the surface of the wafer, as seen in FIG. 3. The conductive top plate layer 32 (FIG. 3) on the thin dielectric layer 31 (FIG. 3) is patterned to form a control gate electrode 42. In this embodiment, both the patterned conductive bottom plate layer 22 and the control gate electrode 42 reside on the field oxide 13 (see also FIG. 3) and do not overlap the transistor active area 9 defined by the source/drain diffusions 17 and the portion of the polysilicon gate electrode 16 between the source/drain diffusions 17 in the view of FIG. 4. The control gate electrode 42 encloses the patterned conductive bottom plate layer 22 and the patterned conductive bottom plate layer 22 encloses the buried contact region 20.

In an alternate embodiment of FIG. 5, a top view illustrates both the patterned conductive bottom plate layer 22 and the control gate electrode 42 as overlapping the transistor active area 9 defined by the source/drain diffusions 17 and the portion of the polysilicon gate electrode 16 between the source/drain diffusions 17 in the view of FIG. 5. The control gate electrode 42 still encloses the patterned conductive bottom plate layer 22 and the patterned conductive bottom plate 22 layer still encloses the buried contact region 20.

In the embodiment of FIG. 4, the EEPROM transistor is programmed by grounding the substrate 10 (FIG. 3) and raising the control gate electrode 42 to a positive programming voltage, as discussed above. The EEPROM transistor is erased by grounding the control gate electrode 42 and raising a source/drain diffusion 17 to a positive erasure voltage. The programming voltage is higher than the erasure voltage because, while the erasure voltage is applied directly across the gate oxide 15 (FIG. 3), the programming voltage is applied to the control gate electrode 42 and capacitively coupled onto the floating gate electrode 41 by capacitive voltage division. This capacitive voltage division results from two series capacitors. The first series capacitor is formed by the common area of the control gate electrode 42, the thin dielectric layer 31 (FIG. 3), and the floating gate electrode 41. The second series capacitor is formed by the common area of the floating gate electrode 41, the gate oxide 15 (FIG. 3), and the substrate 10 (FIG. 3).

Advantageously, the thin dielectric layer 31 is already thin with high dielectric constant so as to optimize DRAM memory cell capacitance. This increases the first series capacitor value and decreases the programming voltage needed at the control gate electrode 42 to cause Fowler-Nordheim tunneling of electrons across the gate oxide 15.

The first series capacitor value can be further increased by increasing the common area of the control gate electrode 42, the thin dielectric layer 31 (FIG. 3), and the floating gate electrode 41. However, a parasitic capacitance between the patterned conductive bottom plate layer 22 and the substrate 10 (FIG. 3) also increases as the patterned conductive bottom plate layer 22 area increases. By increasing the interpoly dielectric layer 18 (FIG. 3) thickness, this parasitic capacitance can be reduced.

It can be seen that the present invention implements reprogrammable nonvolatile memory on a DRAM integrated circuit by forming a floating gate transistor using processing steps which are compatible with a conventional DRAM process. Although the above embodiment has been illustrated and described with respect to storage of digital data on the floating gate transistor, it will be appreciated by one skilled in the art that analog data may accommodated by varying the quantity of charge stored on the floating gate transistor.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. An integrated circuit transistor, comprising:
    an electrically isolated floating gate comprising a gate region having a gate electrode connected to a first portion of a patterned and etched conductive layer through a first buried contact opening in an insulating layer formed over at least a portion of the gate electrode that is outside the active region directly beneath the floating gate;
    a dielectric layer formed on the conductive layer;
    a conductive top plate layer formed on the dielectric layer; and
    wherein a second portion of the conductive layer serves as a dynamic random access memory (DRAM) cell storage capacitor bottom plate electrode of a DRAM cell array wherein a second buried contact region in the DRAM cell array connects the DRAM cell storage bottom plate electrode and a DRAM cell access transistor source/drain diffusion and wherein the first and second portions of the conductive layer are of an identical material and formed simultaneously.

2. The transistor of claim 1 wherein the gate electrode and first and second conductive layers comprise conductively doped polycrystalline silicon.

3. The transistor of claim 1 wherein the dielectric layer comprises silicon nitride.

4. An integrated circuit transistor, comprising:
    an electrically isolated floating gate comprising a gate region having a gate electrode connected to a first portion of a patterned and etched conductive layer through a first buried contact opening in an insulating layer formed over at least a portion of the gate electrode that is outside the active region directly beneath the floating gate;

a dielectric layer formed on the conductive layer;

a conductive top plate layer formed on the dielectric layer;

wherein a second portion of the conductive layer serves as a dynamic random access memory (DRAM) cell storage capacitor bottom plate electrode of a DRAM cell array wherein a second buried contact region in the DRAM cell array connects the DRAM cell storage bottom plate electrode and a DRAM cell access transistor source/drain diffusion and wherein the first and second portions of the conductive layer are of an identical material and formed simultaneously; and wherein the conductive top plate layer is also utilized in the DRAM cell array as a memory cell storage capacitor top plate electrode wherein the conductive top plate layer and the capacitor top plate layer electrode are electrically isolated from each other.

5. The transistor of claim 4 wherein the gate region, conductive layer, and the top plate layer comprise conductively doped polycrystalline silicon.

6. The transistor of claim 4 wherein the dielectric layer comprises silicon nitride.

7. An integrated circuit transistor, comprising:

an electrically isolated floating gate comprising a gate region of conductively doped polysilicon having a gate electrode connected to a first portion of a patterned and etched conductive layer of conductively doped polysilicon through a first buried contact opening in an insulating layer formed over at least a portion of the gate electrode that is outside the active region directly beneath the floating gate and wherein the gate region and the first portion of the conductive layer are together completely enclosed by insulating material;

a dielectric layer formed on the conductive layer;

a conductive top plate layer of conductively doped polysilicon formed on the dielectric layer;

wherein a second portion of the conductive layer serves as a dynamic random access memory (DRAM) cell storage capacitor bottom plate electrode of a DRAM cell array wherein a second buried contact region in the DRAM cell array connects the DRAM cell storage bottom plate electrode and a DRAM cell access transistor source/drain diffusion and wherein the first and second portions of the conductive layer are of an identical material and formed simultaneously; and wherein the conductive top plate layer is also utilized in the DRAM cell array as a memory cell storage capacitor top plate electrode wherein the conductive top plate layer and the capacitor top plate layer electrode are electrically isolated from each other.

8. The transistor of claim 7 wherein the gate electrode and first and second and top plate conductive layers comprise conductively doped polycrystalline silicon.

9. The transistor of claim 7 wherein the dielectric layer comprises silicon nitride.

10. An integrated circuit substrate having both a dynamic random access memory cell and an electrically reprogrammable transistor fabricated thereon, comprising:

a plurality of active regions formed on a substrate and electrically isolated from each other, the active regions including both dynamic random access memory cell regions and electrically reprogrammable transistor regions;

a plurality of field-effect transistor (FET) source/drain regions in the dynamic random access memory cell active regions;

a plurality of FET gate regions formed in the electrically reprogrammable transistor active regions and having at least one gate electrode layer extending at least partially outside of the active regions;

a first insulating layer formed over the substrate and the active regions;

a buried contact opening formed through the first insulating layer and over at least a portion of the electrically programmable transistor gate region outside the active region for providing access to at least a portion of the underlying gate region of the electrically programmable transistor gate region;

a further buried contact opening through the first insulating layer and over at least a portion of the FET source/drain region in the dynamic random access memory cell for providing access to at least a portion of the underlying source/drain region;

a conductive layer within the buried contact openings and on the first insulating layer for physically and electrically contacting the exposed portion of the underlying electrically reprogrammable transistor gate region and the DRAM cell source/drain region;

a dielectric layer formed on the conductive bottom plate layer and over the entire substrate; and a conductive top plate layer formed on the dielectric layer and patterned and etched for electrically isolating the portions of the plate layer over each of the active areas from each other.

11. The invention of claim 10 wherein the gate region, conductive layer, and conductive top plate layer comprise conductively doped polycrystalline silicon.

12. The invention of claim 10 wherein the dielectric layer comprises silicon nitride.

13. An integrated circuit, comprising:

a gate oxide layer;

a first conductive layer overlying the gate oxide layer, the first conductive layer functioning as a gate electrode of a first transistor; and a second conductive layer functioning as a memory cell bottom plate electrode overlying the first conductive layer and a third conductive layer, wherein the second and third conductive layers are simultaneously formed over first and second buried contact openings that expose the first conductive layer and a source/drain region of a second transistor respectively and the second and third conductive layers are of an identical material and electrically isolated from each other and wherein the first buried contact region extends outside of a source/drain region controlled by the transistor floating gate.

14. The circuit of claim 13 wherein the gate electrode and first and second conductive layers comprise conductively doped polycrystalline silicon.

15. The circuit of claim 13 wherein the dielectric layer comprises silicon nitride.

16. An integrated circuit transistor, comprising:

a transistor active region surrounded by a field oxide region on a substrate, the active region including source/drain implants and a gate region oxide layer overlying a portion of the active region;

a floating gate electrode having a portion thereof formed over the gate region oxide layer and a further portion formed over the field oxide region;

a dielectric layer formed over the transistor active region and the surrounding field oxide region;

a first portion of a conductive layer formed above the dielectric layer and connected to the gate electrode through a buried contact opening etched through the dielectric layer and contacting the further portion of the gate electrode lying outside the active region; and a second portion of a conductive layer serves as a memory cell storage capacitor bottom plate electrode of a memory cell array wherein a further buried contact opening in the memory cell array connects the memory cell storage capacitor bottom plate electrode and a memory cell access transistor source/drain diffusion.

17. The transistor of claim 16 wherein the gate electrode and the first and second portions of the conductive layer comprise conductively doped polycrystalline silicon.

18. An integrated circuit transistor, comprising:

a transistor active region surrounded by a field oxide region on a substrate, the active region including source/drain implants and a gate region oxide layer overlying a portion of the;

a floating gate electrode having a portion thereof formed over the gate region oxide layer and a further portion formed over the field oxide region;

a dielectric layer formed over the transistor active region and the surrounding field oxide region;

a first portion of a conductive layer formed above the dielectric layer and connected to the gate electrode through a buried contact opening etched through the dielectric layer and contacting the further portion of the gate electrode lying outside the active region.

a second portion of a conductive layer serves as a memory cell storage capacitor bottom plate electrode of a memory cell array wherein a further buried contact opening in the memory cell array connects the memory cell storage capacitor bottom plate electrode and a memory cell access transistor source/drain diffusion and wherein the first and second portions of the conductive layer are of an identical material and formed simultaneously; and wherein a further conductive layer is also utilized in the memory cell array as a memory cell storage capacitor top plate electrode wherein the conductive layer and the capacitor top plate layer electrode are electrically isolated from each other.

19. The transistor of claim 18 wherein the gate electrode and the first and second and further conductive layers comprise conductively doped polycrystalline silicon.

* * * * *

UNITED STATES PATENT AND TRADEMARK OFFICE
CERTIFICATE OF CORRECTION

PATENT NO. : 6,924,522 B2
DATED : August 2, 2005
INVENTOR(S) : Ma et al.

It is certified that error appears in the above-identified patent and that said Letters Patent is hereby corrected as shown below:

Column 3,
Line 7, delete "an" and insert -- a --.

Column 6,
Line 21, after "may" insert -- be --.

Column 9,
Line 22, after "overlying a portion of the" insert -- source drain implant --.

Column 10,
Line 5, after "region" delete "." and insert -- ; --.

Signed and Sealed this

Third Day of January, 2006

JON W. DUDAS
*Director of the United States Patent and Trademark Office*